(12) United States Patent
Bourdeau

(10) Patent No.: US 7,035,369 B2
(45) Date of Patent: Apr. 25, 2006

(54) APPARATUS AND METHOD FOR A PROGRAMMABLE CLOCK GENERATOR

(75) Inventor: Richard Bourdeau, St. Laurent (CA)

(73) Assignee: Harris Corporation, Melbourne, FL (US)

( * ) Notice: Subject to any disclaimer, the term of this patent is extended or adjusted under 35 U.S.C. 154(b) by 43 days.

(21) Appl. No.: 10/843,458

(22) Filed: May 12, 2004

(65) Prior Publication Data

US 2005/0254615 A1    Nov. 17, 2005

(51) Int. Cl.
*H03K 21/00* (2006.01)
(52) U.S. Cl. .......................................... 377/48; 377/47
(58) Field of Classification Search ................... None
See application file for complete search history.

(56) References Cited

U.S. PATENT DOCUMENTS

| 4,078,203 | A | * | 3/1978 | Borst ........................... 377/47 |
| 4,991,188 | A | * | 2/1991 | Perkins ......................... 377/49 |
| 5,088,057 | A | * | 2/1992 | Amrany et al. ............. 708/103 |
| 6,434,707 | B1 | * | 8/2002 | Eklof ........................... 713/500 |
| 6,449,291 | B1 | * | 9/2002 | Burns et al. ................ 370/516 |
| 6,493,471 | B1 | * | 12/2002 | Zwartenkot et al. ........ 382/298 |
| 6,650,721 | B1 | * | 11/2003 | Janesch et al. ............. 375/376 |
| 6,927,716 | B1 | * | 8/2005 | Keaveney et al. ........... 341/143 |
| 2004/0008805 | A1 | * | 1/2004 | Xiu et al. .................... 375/376 |

\* cited by examiner

*Primary Examiner*—Timothy P. Callahan
*Assistant Examiner*—Cassandra Cox
(74) *Attorney, Agent, or Firm*—Duane Morris LLP

(57) ABSTRACT

A gateless digital circuit and method for generating a second clock with a frequency of N/M of the frequency of a first clock, wherein N and M are integers, $N \leq M/2$. The gateless digital circuit having a modulo M function, a register and a adder operable connected to generate the second clock, where both N and M are independently selectable.

11 Claims, 4 Drawing Sheets

APPARATUS AND METHOD FOR A PROGRAMMABLE CLOCK GENERATOR

BACKGROUND

Very often in digital communication circuits it is required to generate a clock signal whose frequency ($f_2$) is related to the frequency ($f_1$) of another clock signal. In other words we have: $f_2=f_1 \cdot K=f_1 \cdot N/M$ where N<M; N and M do not have any common factors. An example of an application in which two related clocks are used is a Forward Error Correction (FEC) circuit. Typically, a FEC adds an overhead of typically M/N clock cycles. Then any circuit after the FEC will use a clock frequency of $f_1$ and the circuits before the FEC will use a clock frequency of $f_2=f_1 \cdot N/M$.

However, as in the above example, the ratio of $f_2$ over $f_1$ is not an integer. One prior art approach to generate that clock is to use a phase locked loop (PLL) 100, as shown on FIG. 1. The circuit 100 includes a phase detector 103, a loop filter 104 and a voltage controlled oscillator 105 arranged as well known in the art. The frequency $f_1$ is first divided by M in block 101 (which can be a frequency divider or other known device) and then multiplied by N in the loop 102. The disadvantages of this approach are that PLLs use analog circuits which require additional components to interface with digital circuitry and analog circuits can be sensitive to temperature variations, etc., and generally are attendant with additional cost.

Another prior art approach is to use a gapped clock circuit 200 as shown in FIG. 2. The circuit includes a gap logic circuit 201; a flip-flop 202 and an "OR" gate 203. In this circuit, the gap logic 201 is a state machine that generates a logic signal called "Gap" such that, for each period of M clock cycle, the "Gap" signal is low for N clock cycles and high for the rest of the time. Then the output frequency is $f_2=f_1 \cdot N/M$.

The disadvantage of this circuit is that it requires the use of a gated clock, which is not desirable in a digital circuit. The timing requirement at the input of the "OR" gate 203 are very critical. If the timing requirements are not addressed, glitches could occur at the output which could cause a malfunction and generate an output clock that fails to provide the N/M ratio.

Another prior art approach is to use a Direct Digital Synthesis (DDS) circuit 300 as shown in FIG. 3. In this circuit, a register 301 acts as an accumulator and is clocked with a frequency $f_1$, and it adds N to its previous value by adder 303. Since the accumulator uses B bits, it will overflow when it reaches $C \geq 2^B$, so it is in fact a modulo C accumulator and thus can only be changed in parallel with a corresponding accumulator and is limited in the values it can assume. The output of the register is provided to a comparator 302 clocked by $f_1$ and produces an output frequency of $f_2=f_1 \cdot N1/C$, with the restriction of: $N1 \leq C/2$ and N1 being an integer.

However, to accomplish a ratio of N/M, the equation N1/C=N/M, is solved for N1 which is the only variable parameter, since the circuit uses a fixed or constant term C, N1=N·C/M. But in many cases N1 will not be an integer, so it will not be feasible to generate exactly $f_2$. The disadvantage of this circuit is that C is not programmable, and thus the circuit 300 cannot generate all the possible values of N/M. For example, if C were 8 corresponding to a three bit accumulator, ratios of 1/8, 2/8, and 3/8 would be possible, however ratios of 3/16 and 5/16 that lie between 1/8 and 3/8, to list just a few, would not be possible.

Therefore there is a need to obviate the disadvantages of the prior art and provide a digital circuit for generating a clock signal that is N/M of another clock signal, where both N and M are selectable.

It is an object of this disclosure to present a novel circuit and method for generating a clock signal that is a function of a selectable ratio N/M.

It is also an object of the disclosure to present a novel gateless digital circuit for generating a second clock with a frequency of N/M of the frequency of a first clock, wherein N and M are integers, $N \leq M/2$. The gateless digital circuit having a counter, a register and an adder operable connected to generate the second clock, and both N and M are independently selectable.

It is further an object of the disclosure to present a novel improved direct digital synthesizer for generating a clock signal with a frequency of N1/M1 of a first clock frequency. The direct digital synthesizer having an adder, register and comparator, wherein the register and comparator are driven by the first clock, the adder adds N1 and the output of the register and outputs the sum to the register which outputs B bits into the comparator and wherein N is selectable. The novel improvement having a modulo M circuit between the adder and the register and replacing the fixed comparator of M1 with a variable M comparator, where M is selectable.

It is still an object of the disclosure to present a novel digital circuit for generating a second frequency clock from a first frequency clock where the second frequency is a ratio N/M of the first frequency, where N and M are adjustable integers, $N \leq M/2$ and $M < 2^B$. The digital circuit having an adder, one input being N and the other input from a register; a modulo M function, the function receiving an adder output; the register clocked by the first frequency clock and receiving the modulo M output, and, a comparator clocked by the first frequency clock, the comparator receiving the register output and outputting the second frequency clock. The adder, modulo M function, register and comparator having a B bit capacity.

It is again an object of the disclosure to present a novel digital circuit for generating a sine wave of a second frequency from a first frequency clock where the second frequency is a ratio N/M of the first frequency, where N and M are adjustable integers, $N \leq M/2$ and $M < 2^B$. The digital circuit having an adder with one input being N and the other input from a register; a modulo M function, the function receiving an adder output; the register clocked by the first frequency clock and receiving the modulo M output, and, a look up table receiving the register output and outputting a corresponding magnitude to create the sine wave of the second frequency. The adder, modulo M function and register having a capacity of B bits.

It is another object of the present disclosure to present a novel method for digitally generating a second clock from a source clock in a digital circuit, where the frequency of the second clock is N/M times the frequency of the source clock, and N and M are selectable integers. The novel method including the steps of: selecting an integer N; selecting an integer M, where $N \leq M/2$; determining the Modulo M of a sum and providing the Modulo M as an input to a register; outputting a second clock from a comparator if the register output is greater than M/2; adding the output of the register to N to obtain the sum; and, clocking the register and the comparator from the source clock; thereby generating a second clock from the source clock.

It is yet another object of the disclosure to present a novel digital circuit for generating a second frequency clock from a first frequency clock where the second frequency is a ratio N/M of the first frequency, where N and M are adjustable integers, $N \leq M/2$ and $2^B > M \geq (2^B - N)$. The digital circuit having an adder with one input being N and the other input from a register; a modulo M function, the function receiving an adder output; and the register clocked by the first frequency clock and receiving the modulo M output. The register outputting the second frequency clock as the most significant bit; where the adder, modulo M function and register have B bits.

These objects and other advantages of the disclosed subject matter will be readily apparent to one skilled in the art to which the disclosure pertains from a perusal or the claims, the appended drawings, and the following detailed description of the preferred embodiments.

DETAILED DESCRIPTION

Figure 1:
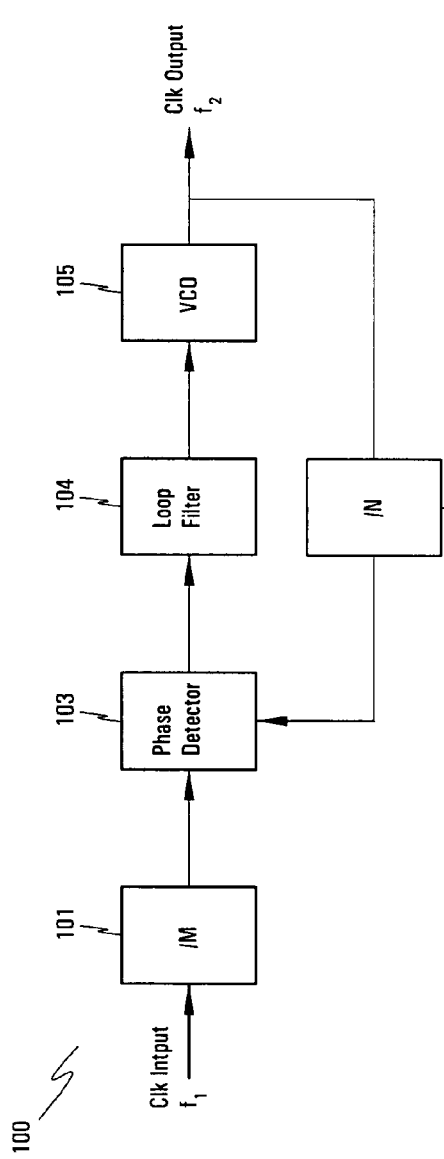
FIG. 1 is a representation of a prior art phase locked Loop (PLL)
Figure 2:
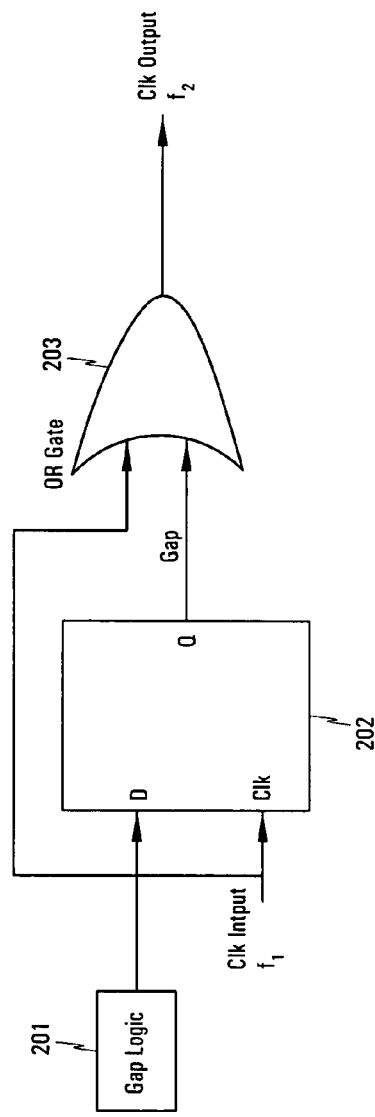
FIG. 2, is a representation of a prior art Gapped Clock
Figure 3:
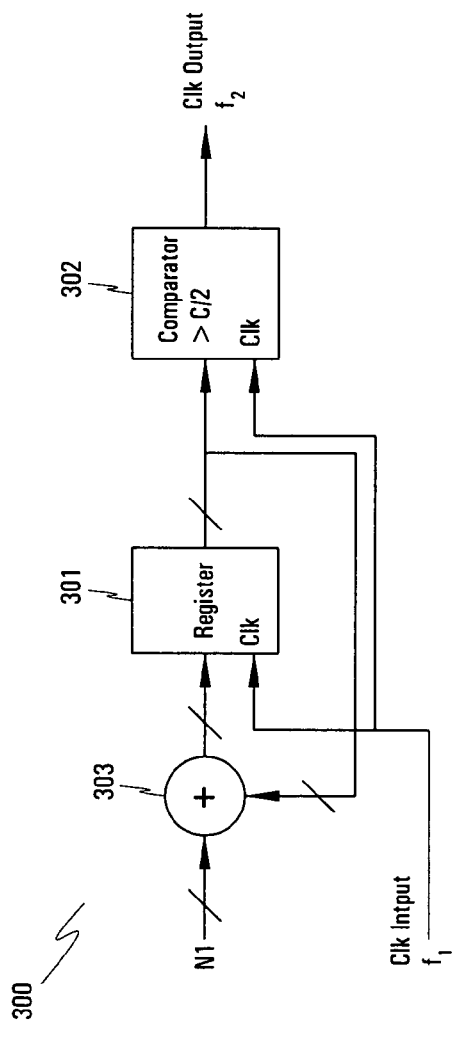
FIG. 3 is a representation of a prior art Direct Digital synthesis circuit.
Figure 4:
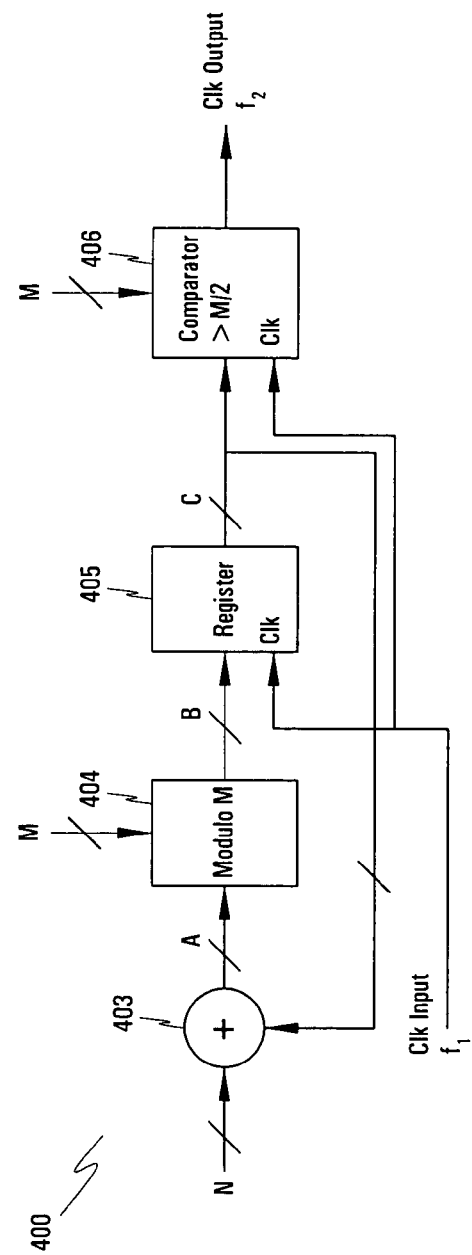
FIG. 4 is an embodiment according to the present disclosure.

The subject matter described herein uses a novel circuit 400, as shown in FIG. 4. The circuit uses an adder 403, a register 405 and a comparator 406 as found in the prior Art DDS circuit however it includes a modulo M function 404 between the adder 403 and the register 405 and unlike the prior art DDS, both N and M are programmable, thereby enabling any ratio less than 1/2 subject to the bit capacity of the components. The circuit 400 produces an output frequency of $f_2 = f_1 \cdot N/M$, for any value of N and M, which are both programmable. The restrictions are: $N \leq M/2$ and $M < 2^B$.

Figure 5:
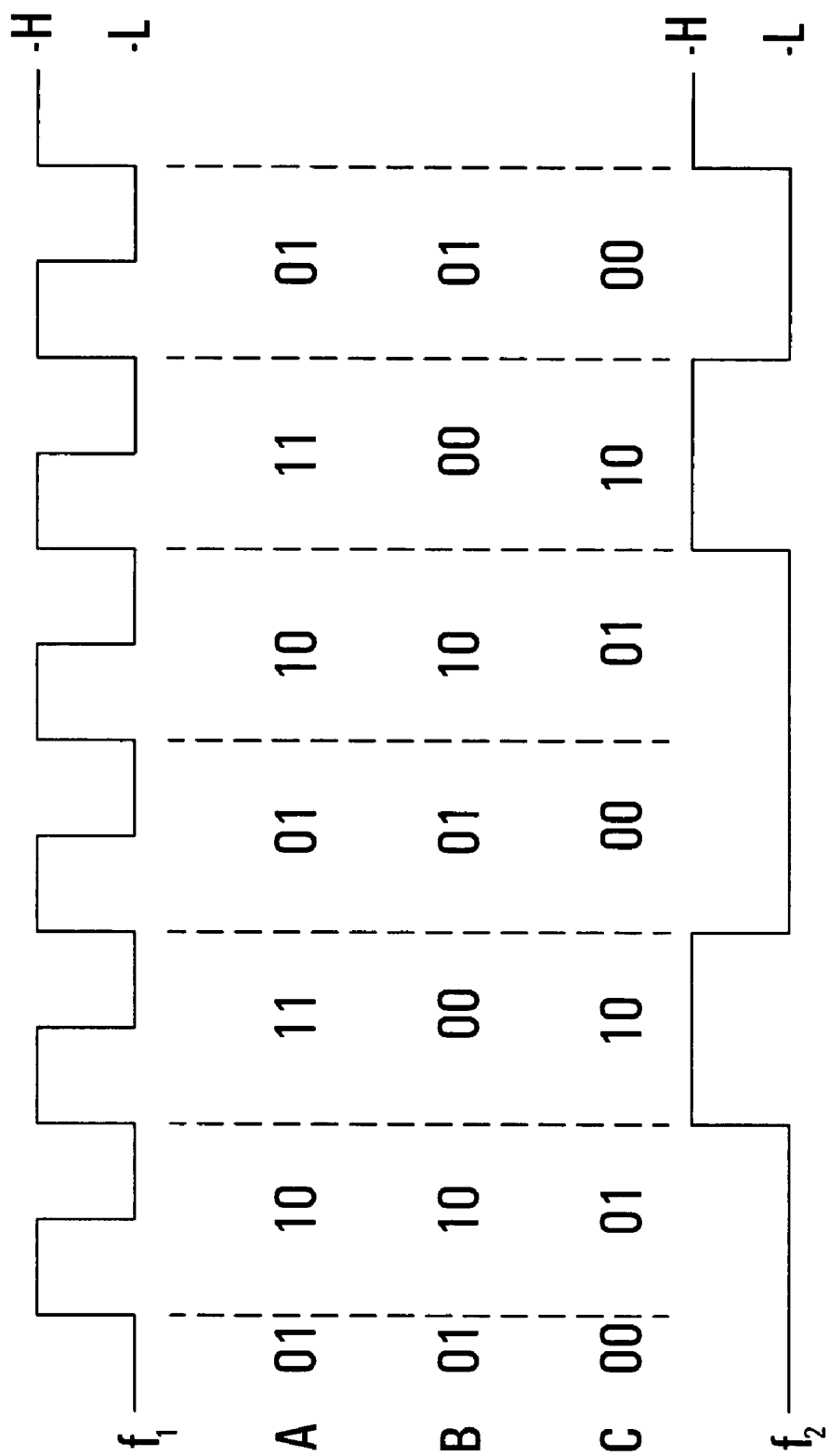
FIG. 5 is a representation of the operation of the circuit of FIG. 4.

FIG. 5 shows a representation of the input clock $f_1$, the output values of the adder, the modulo M function, the register and the output clock $f_2$ where N=1 and M=3 The adder, function, register and comparator are shown as having at least 2 bit capacity, and thus satisfies the restrictions of $M < 2^B$, and $N \leq M/2$. As shown in FIG. 5, "A" is the output of the adder, "B" is the output of the modulo M function, "C" is the output of the register as corresponds to the labeling in FIG. 4. From inspection of FIG. 5, the output $f_2$ is clearly $1/3 f_1$ or $f_2 = f_1 \cdot N/M$, where N=1 and M=3.

Figure 6:
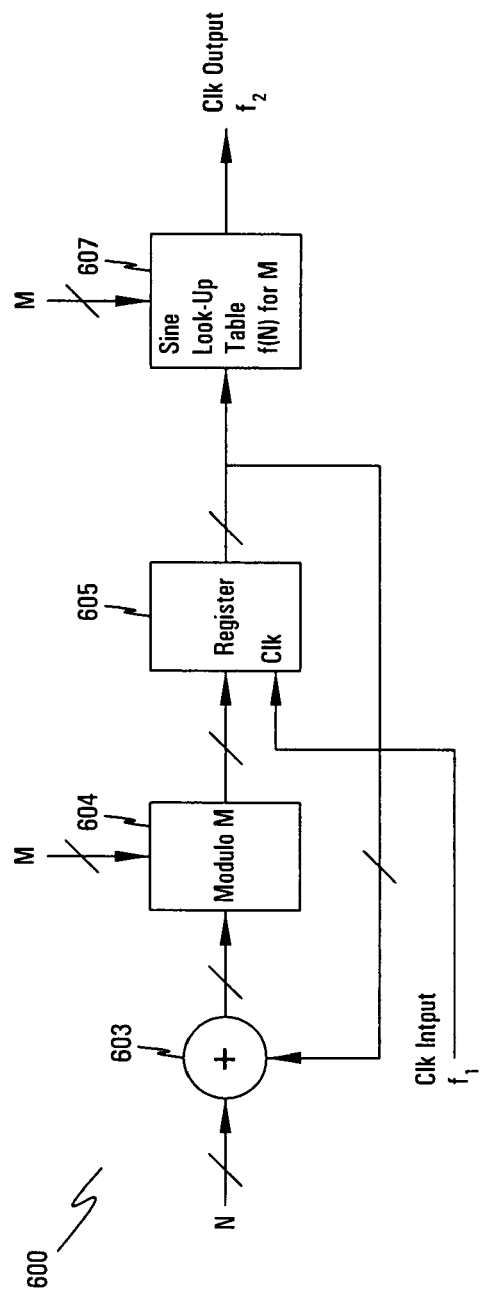
FIG. 6 is another embodiment with a sine look up table according to the present disclosure.

In another embodiment of the disclosed subject matter, the output of the circuit 600 is a sine wave rather than a square wave (clock). The circuit 600 has an adder 603, a modulo M function 604, and register 605 configured similarly to the circuit 400 shown in FIG. 4. To generate a sine wave output signal instead of a square wave (clock) signal, the comparator 406 or FIG. 4 is replaced with a sine Look-Up Table 607 as shown in FIG. 6. The look up table 607 corresponds to a selected M and associates the register output value with an output value for its corresponding position in a sine wave of frequency $f_2$. The resolution of the sine wave output is proportional to M/N as can be seen from FIG. 6 by inspection.

Figure 7:
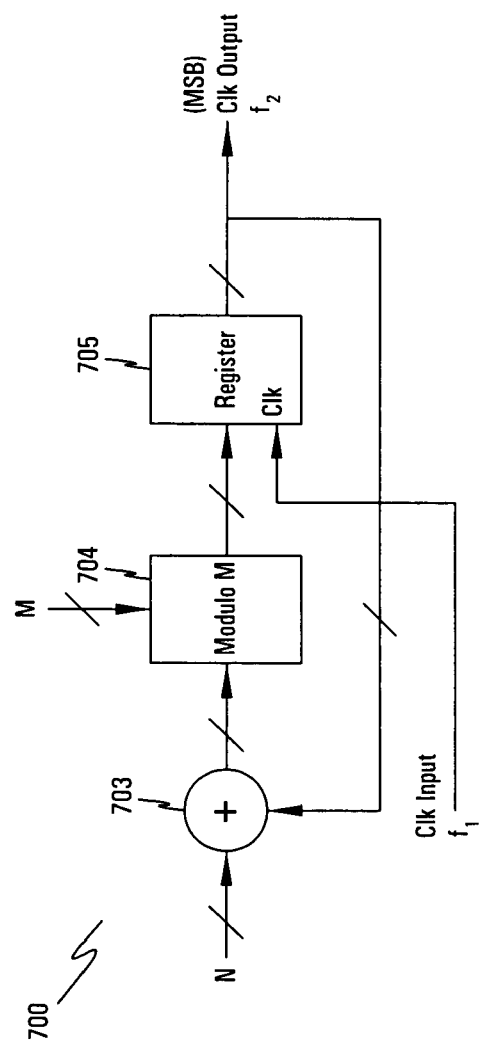
FIG. 7 is another embodiment according to the present disclosure where M is slightly less than $2^B$.

Another embodiment is presented in which the Most Significant Bit (MSB) of the register output can be the clock output $f_2$ as shown in FIG. 7. FIG. 7 is the same circuit as shown in FIG. 4 without the comparator 406. If M is slightly lower than $2^B$, that is if $2^B > M \geq (2^B - N)$, then the comparator 406 can be removed and the MSB of the accumulator is used as the clock output signal $f_2$. This can be seen by inspection of FIG. 5 where M=3, N=1 and B=2, thus ($4 > M \geq 3$). The most significant bit B=2 from the register mimics the second frequency clock $f_2$.

While various values have been applied to N, M, B, $f_1$, $f_2$, they are illustrative only and the scope of the subject matter is not intended to be limited to the specific values shown.

While preferred embodiments of the present inventive system and method have been described, it is to be understood that the embodiments described are illustrative only and that the scope of the embodiments of the present inventive system and method is to be defined solely by the appended claims when accorded a full range of equivalence, many variations and modifications naturally occurring to those of skill in the art from a perusal hereof.

What is claimed:

1. A digital circuit for generating a second frequency clock from a first frequency clock where the second frequency is a ratio N/M of the first frequency, where N and M are adjustable integers, $N \leq M/2$ and $M < 2^B$ comprising:
    an adder, one input being N and the other input from a register;
    a modulo M function, said function receiving an adder output;
    said register clocked by the first frequency clock and receiving the modulo M output, and,
    a comparator clocked by the first frequency clock, said comparator receiving the register output and outputting the second frequency clock;
    wherein said adder, function, register and comparator are B bits.

2. The digital circuit of claim 1, wherein the operation of the comparator is a function of M.

3. A digital circuit for generating a sine wave of a second frequency from a first frequency clock where the second frequency is a ratio N/M of the first frequency, where N and M are adjustable integers, $N \leq M/2$ and $M < 2^B$ comprising:
    an adder, one input being N and the other input from a register;
    a modulo M function, said function receiving an adder output;
    said register clocked by the first frequency clock and receiving the modulo M output, and,
    a look up table receiving the register output and outputting a corresponding magnitude to create the sine wave of the second frequency;
    wherein said adder, modulo M function and register are B bits.

4. The digital circuit of claim 3, wherein the look up table for each M has M/2 register values associated with a magnitude of a sine wave at M/2 increments.

5. A method for digitally generating a second clock from a source clock in a digital circuit, wherein the frequency of the second clock is N/M times the frequency of the source clock, where N and M are selectable integers comprising the steps of:
    selecting an integer N;
    selecting an integer M, where $N \leq M/2$;
    determining the Modulo M of a sum and providing the Modulo M as an input to a register;

outputting a second clock from a comparator if the register output is greater than M/2;

adding the output of the register to N to obtain the sum; and, clocking the register and the comparator from the source clock;

thereby generating a second clock from the source clock.

6. The method of claim 5 wherein the register is a B-bit register and $M \leq 2^B$.

7. The method of claim 5 wherein the Modulo M is determined in a Modulo M function.

8. A Direct digital synthesizer for generating a clock signal with a frequency of N1/M1 of a first clock frequency, having an adder, register and comparator, wherein the register and comparator are driven by the first clock, the adder adds N1 and the output of the register and outputs the sum to the register which outputs B bits into the comparator and wherein N is selectable, the improvement comprising a modulo M circuit between the adder and the register and replacing the fixed comparator of M1 with a variable M comparator, where M is selectable.

9. The synthesizer of claim 8, wherein the variable M comparator further comprises a look up Sine table for each M.

10. A gateless digital circuit for generating a second clock with a frequency of N/M of the frequency of a first clock, wherein N and M are integers, $N \leq M/2$ comprising a function, a register and a adder operable connected to generate the second clock, wherein both N and M are independently selectable, wherein most significant bit (MSB) of the register output is the second clock signal.

11. A digital circuit for generating a second frequency clock from a first frequency clock where the second frequency is a ratio N/M of the first frequency, where N and M are adjustable integers, $N \leq M/2$ and $2^B > M \geq (2^B - N)$ comprising:

an adder, one input being N and the other input from a register;

a modulo M function, said function receiving an adder output;

said register clocked by the first frequency clock and receiving the modulo M output, and, outputting the second frequency clock as the most significant bit;

wherein said adder, modulo M function and register are B bits.

* * * * *